(12) United States Patent
Jerome et al.

(10) Patent No.: US 9,570,494 B1
(45) Date of Patent: Feb. 14, 2017

(54) METHOD FOR FORMING A SEMICONDUCTOR IMAGE SENSOR DEVICE

(71) Applicant: SEMICONDUCTOR COMPONENTS INDUSTRIES, LLC, Phoenix, AZ (US)

(72) Inventors: Rick Jerome, Washougal, WA (US); David T. Price, Gresham, OR (US); Sungkwon C. Hong, Boise, ID (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/869,490

(22) Filed: Sep. 29, 2015

(51) Int. Cl.
*H01L 21/00* (2006.01)
*H01L 27/146* (2006.01)

(52) U.S. Cl.
CPC ....... *H01L 27/1463* (2013.01); *H01L 27/1462* (2013.01); *H01L 27/1464* (2013.01); *H01L 27/14605* (2013.01); *H01L 27/14636* (2013.01); *H01L 27/14685* (2013.01); *H01L 27/14687* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2007/0117253 A1 | 5/2007 | Hsu et al. | |
| 2013/0323875 A1* | 12/2013 | Park | H01L 31/022408 438/70 |
| 2014/0015600 A1 | 1/2014 | Sato | |

* cited by examiner

*Primary Examiner* — Calvin Choi
(74) *Attorney, Agent, or Firm* — Kevin B. Jackson

(57) ABSTRACT

In one embodiment, a method for forming a backside illuminated image sensor includes providing a region of semiconductor material having a first major surface and a second major surface configured to receive incident light. A pixel structure is formed within the region of semiconductor material adjacent the first major surface. Thereafter, a trench structure comprising a metal material is formed extending through the region of semiconductor material. A first surface of the trench structure is adjacent the first major surface of the region of semiconductor material and a second surface adjoining the second major surface of the region of semiconductor material. A first contact structure is electrically connected to one surface of the conductive trench structure and a second contact structure is electrically connected to an opposing second surface.

20 Claims, 10 Drawing Sheets

METHOD FOR FORMING A SEMICONDUCTOR IMAGE SENSOR DEVICE

STATEMENT REGARDING FEDERALLY SPONSORED RESEARCH OR DEVELOPMENT

This invention was made with government support under Agreement No. FA8650-12-3-5504 awarded by the United States Air Force. The government has certain rights in the invention.

CROSS-REFERENCE TO RELATED APPLICATIONS

Not Applicable.

BACKGROUND

The present invention relates, in general, to electronics and, more particularly, to semiconductor device structures and methods of forming semiconductor devices.

Semiconductor based image sensor devices typically comprise a grid of pixels, such as photosensitive diodes or photodiodes, reset transistors, source follower transistors, and/or transfer transistors, which are configured to record the brightness of light. Typical pixels are configured to accumulate charge so that the brighter the light, the larger the accumulated charge. This charge is then transferred to another circuit so that a color and brightness can be used for a selected application, such as surveillance cameras, digital cameras, or video cameras. Common variations of pixels grids include complementary metal oxide semiconductor (CMOS) and charge-coupled device (CCD) image sensors.

There is a type of image sensor referred to as backside illuminated (BSI) sensors, which place the pixel array on a first side of a semiconductor substrate and provide the exposed light through an opposite second side of the semiconductor substrate. In BSI sensors, the semiconductor substrate is provided sufficiently thin so that photons or radiation projected from the second side of the semiconductor substrate can reach the pixel array on the first side of the semiconductor wafer. Among other advantages, BSI sensors provide a high fill factor and reduced destructive interference, as compared to front-side illuminated image sensors.

One problem with BSI sensors is that they are difficult to manufacture because they utilize very complicated and expensive wafer bonding processes. Additionally, BSI sensors typically require deep trench interconnect structures that add further complexity to the process flow. In the past, the deep trench interconnect structures have been formed during the initial steps in the manufacturing process, which has required that doped polysilicon fill materials be used because of subsequent thermal budget requirements. Such interconnect materials are more resistive compared to metal interconnects, and this increased resistance has negatively impacted device performance. Also, previous manufacturing methods have generated silicon defects including stress related silicon defects, which have caused an increase in dark current levels. In addition, the previous manufacturing methods have exhibited poor substrate surface planarity.

Accordingly, improved structures and methods for semiconductor image sensor devices are needed that address the above issues as well as others. Additionally, it would be beneficial for such structures and methods to improve pixel-to-pixel isolation and to improve double-sided mask alignment capability. Further, it would be beneficial for such structures and methods to be cost effective and compatible for manufacturing integration, and to not detrimentally affect device performance.

Figure 1:
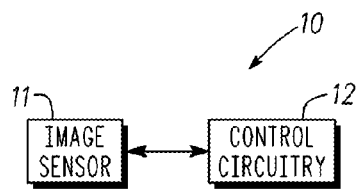
FIG. 1 is a schematic view of an illustrative electronic device configured in accordance with embodiments of the invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. Additionally, it is to be understood that where it is stated herein that one layer or region is formed on or disposed on a second layer or another region, the first layer may be formed or disposed directly on the second layer or there may be intervening layers between the first layer and the second layer. Further, as used herein, the term formed on is used with the same meaning as located on or disposed on and is not meant to be limiting regarding any particular fabrication process. Moreover, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

The present description includes, among other features, a method of forming a backside illuminated (BSI) image sensor device having one or more deep trench interconnect structure or conductive trench structure that has, among other features, a conductive metal fill material that reduces interconnect resistance and improves pixel-to-pixel isolation. The conductive trench structure is formed later (i.e., late deep trench interconnect structure or late conductive trench structure) in the image sensor fabrication process, which among other features, reduces defect formation. Various aspects of the present description can be embodied in different forms and should not be construed as being limited to the example embodiments set forth herein. Rather, these example embodiments of the disclosure are provided to convey various aspects of the disclosure to those of ordinary skill in the art.

FIG. 1 is a schematic view of an illustrative electronic device configured in accordance with embodiments of the present description. Electronic device 10 can be any type of user device that utilizes an image sensor (embodied here as image sensor 11) and is controlled generally by control circuitry 12. For example, electronic device 10 can include a camera, such as a computer camera, still camera, or portable video camera. Electronic device 10 can also include any other components in a typical camera (or otherwise), which are not depicted in FIG. 1 to avoid any distractions from the present embodiments.

Image sensor 11 can capture image data corresponding to a streaming image. For example, image sensor 11 can include any combination of lenses and arrays of cells (e.g., CCD or CMOS sensor cells) for capturing light. Control circuitry 12 may process data generated by image sensor 11, and may perform any suitable operations based on this data. For example, control circuitry 12 can obtain multiple color pixels (e.g., red, green, and/or blue pixels) generated by image sensor 11. Upon obtaining the color pixels, control circuitry 12 can optionally bin the color pixels in one or more dimensions to form one or more pixel groups (e.g., one or more red, green, and/or blue pixel groups). After binning the multiple color pixels, control circuitry 12 can interpolate the one or more pixel groups to output a pixel image. In one embodiment, image sensor 11 comprises a BSI image sensor manufactured in accordance with the embodiments described hereinafter.

Image sensor 11 and control circuitry 12 may be implemented using any suitable combination of hardware and software. In some embodiments, image sensor 11 can be implemented substantially all in hardware (e.g., as a system-on-a-chip (SoC)). This way, image sensor 11 can have a small design that minimizes the area occupied on electronic device 10. In addition, image sensor 11 may have circuit components designed to maximize the speed of operation. Control circuitry 12 may include, for example, one or more processors, microprocessors, ASICS, FPGAs, or any suitable combination of hardware and software.

Figure 2:
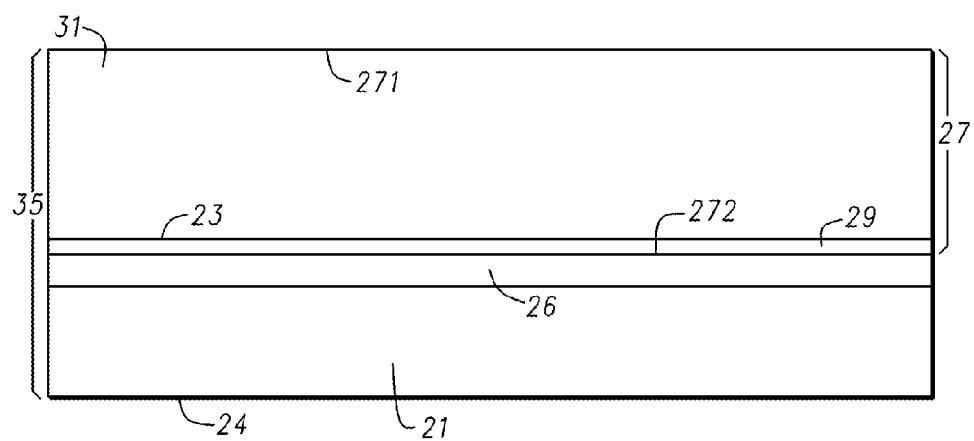
FIG. 2 illustrates a partial cross-sectional view of a semiconductor substrate for manufacturing an image sensor device at an early stage of fabrication in accordance with an embodiment of the present invention.

Turning now of FIGS. 2-17, a method for making an image sensor 11, an image sensor device 11, a BSI image sensor device 11, or a BSI image sensor structure 11 will now be described in accordance with the present embodiment. FIG. 17 illustrates a partial cross-sectional view of image sensor 11 at later stage of fabrication. It is understood that image sensor structure 11 may be among many such structures integrated together within the same semiconductor substrate or body of semiconductor material. FIG. 2 illustrates image sensor 11 at an early stage of fabrication in accordance with the present embodiment.

In accordance with FIG. 2, a semiconductor substrate 21 or a body of semiconductor material 21 is provided having a first major surface 23 and an opposing second major surface 24. In one embodiment, semiconductor substrate 21 can comprise a p-type substrate and may have resistivity in a range from about 5 ohm-cm to about 25 ohm-cm. In one embodiment, semiconductor substrate 21 can have a thickness in a range from about 700 microns to about 800 microns for 200 millimeter substrate. A dielectric region 26, such as a first dielectric region 26 is disposed adjacent to or proximate to major surface 23. In one embodiment, dielectric region 26 is spaced apart from major surface 23 and is within an upper portion of semiconductor substrate 21. In one embodiment, dielectric region 26 comprises one or more dielectric layers or regions. In one embodiment, dielectric region 26 comprises a buried oxide (BOX) region formed by ion implanting oxygen through major surface 23 of semiconductor substrate 21. Such techniques are commonly referred to separation by implantation of oxygen or SIMOX techniques. In one embodiment, a pre-implant dielectric layer can be deposited on or over major surface 23 before forming dielectric region 26. In one embodiment, dielectric region 26 has a thickness in a range from about 150 Angstroms to about 300 Angstroms. In an alternative embodiment as will be described in conjunction with FIGS. 2 and 3, dielectric region 26 can have a thickness in a range from about 150 Angstroms to about 3000 Angstroms.

In one embodiment, a region of semiconductor material 27 or a semiconductor region 27, such as a first semiconductor region 27 is disposed adjacent to dielectric region 26. In one embodiment, semiconductor region 27 comprises a first semiconductor layer 29 adjoining major surface 23, which can be a p-type region having a typical resistivity in a range from about 8 ohm-cm to about 10 ohm-cm. In one embodiment, first semiconductor layer 29 can have a thickness in range from about 500 Angstroms to about 1000 Angstroms. Semiconductor region 27 can further comprise a second semiconductor layer 31 disposed on or overlying first semiconductor layer 29. In one embodiment, second semiconductor layer 31 can be a p-type region having a typical resistivity in a range from about 60 ohm-cm to about 100 ohm-cm, and can have thickness in a range from about 3 microns to about 100 microns. In one embodiment, second semiconductor layer 31 has a graded dopant profile. For example, in one embodiment, the upper portion of second semiconductor layer has a substantially uniform dopant profile (e.g., approximately 80 ohm-cm) and the lower portion has an generally linearly increasing dopant profile as second semiconductor layer 31 approaches dielectric region 26. It was found that, among other things, this profile creates an electric field that aids in carrier drift and charge collection for image sensor 11. In one preferred embodiment, second semiconductor layer 31 has a thickness in a range from about 8 to 10 microns. This thickness is an advantage over prior devices that are limited to thicknesses of about 2 microns because of processing constraints. The increased thickness of the present embodiment was found to better capture the full visible spectrum of light and longer wavelengths, such as near infra-red (NIR). In one embodiment, semiconductor substrate 21 and semiconductor region 27 comprise silicon, and semiconductor region 27 can be formed using, for example, silicon epitaxial growth processes or other processes as known to those of skill in the art.

Semiconductor region 27 comprises a surface 271 or major surface 271 that is spaced apart from dielectric region 26, and a surface or major surface 272 that adjoins dielectric region 26 as generally illustrated in FIG. 2. In accordance with the present embodiment, major surface 271 is configured for forming image capturing and image processing structures (described hereinafter), and major surface 272 is configured to receive incident light waves and to accommodate conductive contacts, such as input/output pads, for image sensor 11. In one embodiment, semiconductor substrate 21, dielectric region 26, and semiconductor region 27 are referred to as starting semiconductor substrate 35.

Figure 3:
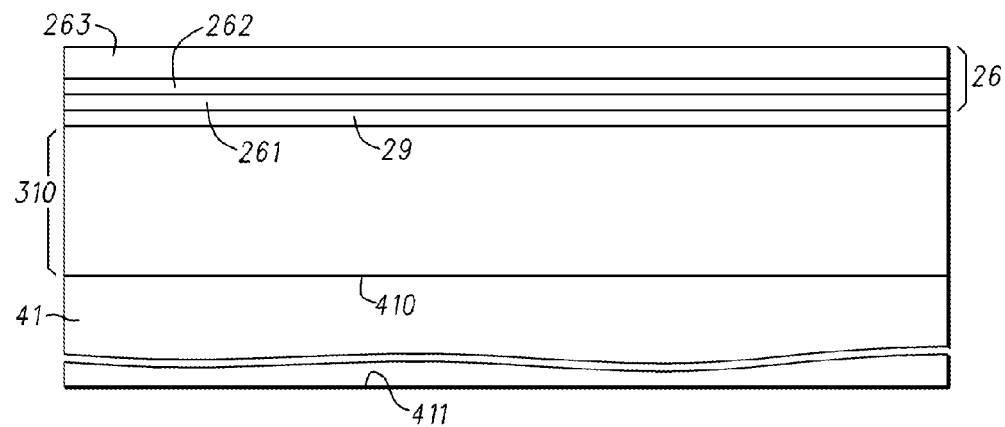
FIGS. 3 and 4 illustrate partial cross-sectional views of a semiconductor substrate at successive steps in fabrication in accordance with an alternative method of the present invention for manufacturing the semiconductor substrate of FIG. 2.
Figure 4:
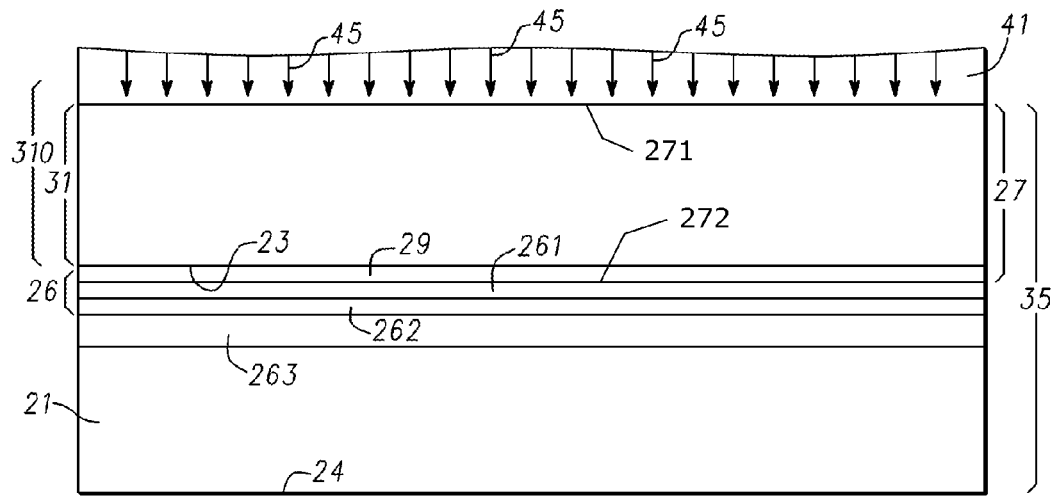

FIGS. 3 and 4 illustrate partial cross-sectional views of an alternative method of providing or preparing starting semiconductor substrate 35. In one embodiment, a first semiconductor substrate 41 or a carrier substrate 41 is provided having first and second opposing major surfaces 410 and 411 respectively. In one embodiment, a semiconductor layer 310 is disposed on or overlying major surface 410 of semiconductor substrate 41. In one embodiment, semiconductor layer 310 is formed using epitaxial growth techniques or other techniques as known to those of skill in the art. In one embodiment, semiconductor layer 310 has the same dopant profile as semiconductor region 27, and can have a thickness in a range from about 8 microns to about 15 microns.

In one embodiment, a dielectric layer 261 or a first pad dielectric layer 261 is formed on or overlying semiconductor layer 310. In one embodiment, dielectric layer 261 comprises an oxide and has thickness from about 250 Angstroms to about 500 Angstroms. One feature of the present embodiment is that dielectric layer 261 is configured to establish a clean dielectric interface with semiconductor layer 310 early in the process with portions of dielectric layer 261 remaining in the finished image sensor 11. Among other things, this improves the integrity of this interface and improves the reliability of image sensor 11. In one embodiment, one or more p-type ion implants can be used to form semiconductor layer 29. In one embodiment, the implanted dopant can be annealed in subsequent step to activate the implanted dopant for semiconductor layer 29.

Next, a dielectric layer 262 or a second pad dielectric layer 262 is formed on or overlying dielectric layer 261. In one embodiment, dielectric layer 262 comprises a different material than dielectric layer 261. In one embodiment, dielectric layer 262 can comprises a silicon nitride and can have a thickness in a range from about 250 Angstroms to about 400 Angstroms. In one embodiment, a low pressure chemical deposition (LPCVD) process can be used to form dielectric layer 262. A dielectric layer 263 or third pad dielectric layer 263 is then formed on or overlying dielectric layer 262. In one embodiment, dielectric layer 263 comprises a different material than dielectric layer 262. In one embodiment, dielectric layer 263 comprises a deposited oxide having a thickness in range from about 1,750 Angstroms to about 2,300 Angstroms. In one embodiment, dielectric layer 263 can be formed using LPCVD techniques. A densification anneal can be used to densify the deposited dielectric materials. In accordance with the present embodiment, dielectric layers 261-263 can be configured as dielectric region 26.

FIG. 4 illustrates the structure of FIG. 3 after further processing. In one embodiment, a second semiconductor substrate, such as semiconductor substrate 21, is attached to dielectric layer 263 using, for example, silicon-on-insulator (SOI) wafer bonding techniques as known to those of skill in the art. Preferably, semiconductor substrate 21 has a thin oxide layer, such as a thin thermal oxide, on the surface of semiconductor substrate 21 attached to dielectric layer 263. Next, all or portions of semiconductor substrate 41 (including in some embodiments, portions of semiconductor layer 310) are removed (as generally represented by vertically oriented arrows 45) to leave semiconductor layer 31 of semiconductor region 27 having a desired thickness as described previously. In one embodiment, grinding and polishing processes or similar processes known to those of skill in the art can be used to remove semiconductor substrate 41. In another embodiment, wet or dry etching can be used to selectively stop at a differentially doped silicon interface above semiconductor layer 31 prior to final exposure of semiconductor layer 31. This provides starting semiconductor substrate 35 configured for additional processing in the manufacture of image sensor 11 in accordance with the present embodiment. Other techniques can be used to manufacture starting semiconductor substrate 35 including, but not limited to, wafer bond and etch back (BESOI) techniques for thin SOI, wafer bond and grind back (BG-SOI) for thicker SOI, and ultra-thin SOI (UTSOI) techniques, such as the SmartCut™ UTSOI process available from Soitec of Bernin, France and its licensees.

Figure 5:
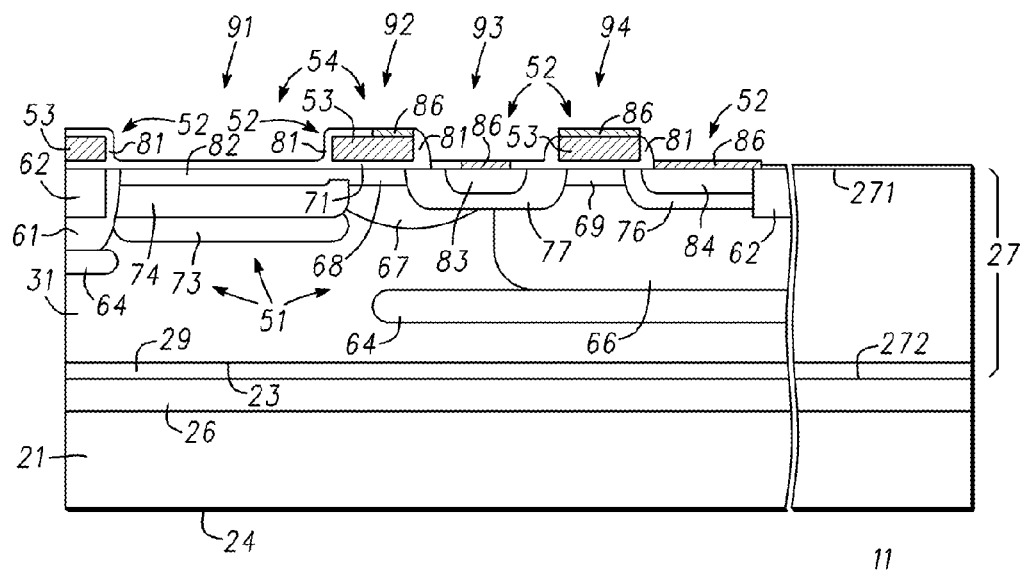
FIGS. 5-13 illustrate partial cross-sectional views of the semiconductor substrate of FIG. 2 at various stages of fabrication of an image sensor device in accordance with an embodiment of the present invention.

FIG. 5 illustrates a partial cross-sectional view of image sensor 11 after additional processing to provide or form a plurality of doped regions 51 and a plurality of conductive structures 52 including a plurality of conductive gate structures 53 in part of semiconductor region 27 in accordance with one embodiment. In one embodiment, doped regions 51 and conductive structures 52 are configured as a pixel structure 54 that can be repeated across semiconductor region 27 in a desired pixel array pattern. In one embodiment, doped regions 51 can be formed within semiconductor region 27 and conductive structures 52 can be formed at least partially on semiconductor region 27.

By way of non-limiting example, doped regions 51 can include doped regions or layers of n-type conductivity and p-type conductivity formed using masking and doping techniques as known to those of skill in the art. In one embodiment, shallow trench isolation (STI) doped regions 61 (only one region illustrated) are formed prior to forming STI regions 62. In one embodiment, deep p-well doped regions 64 are selectively formed in semiconductor region 27 spaced apart from major surface 271. In one embodiment, a p-well doped region 66 is formed to provide, for example, a p-well region for a pixel, source follower and/or reset transistor structures. In one embodiment, a transfer gate well doped region 67 is provided adjacent to p-well region 66. In one embodiment, a threshold voltage adjust doped layer 68 is provided adjacent transfer gate well doped region 67 and a low threshold doped region 69 for the source follower is provided within p-well doped region 66.

In one embodiment, one or more gate dielectric layers 71 (e.g., thin and/or thick) are provided on major surface 271 and conductive gate structures 53 are selectively provided on gate dielectric layers 71. In one embodiment, a deep photodiode doped region 73 is provided in a portion of semiconductor region 27 spaced apart from major surface 271. In one embodiment, a shallow photodiode doped region 74 is provided between major surface 271 and deep photodiode doped region 73. A laterally doped drain (LDD) region 76 can be provided in p-well doped region 66 and a floating diffusion doped region 77 is provided overlapping p-well doped region 66 and transfer gate well doped region 67.

In one embodiment, after forming spacer regions 81, a photodiode pinning doped region 82 is formed between major surface 271 and shallow photodiode region 74, and a floating diffusion contact doped region 83 is formed within floating diffusion doped region 77. Further, a doped region 84 is formed within LDD region 76. In one embodiment, conductive regions 86, such as salicide regions 86 are formed on portions of major surface 271 to provide contact to the various doped regions and conductive gate structures. In one embodiment, conductive regions 86 can comprise cobalt salicide structures or similar structures as known to those of skill in the art. In one embodiment, doped regions 51 and conductive structures 52 are configured to provide a photodiode 91, a transfer gate 92, a floating diffusion 93, and a reset gate 94. It is understood that additional doped regions or fewer doped regions can be used. In accordance with the present embodiment, image sensor 11 has been processed through substantially all or all of the required highest temperature and longest duration processes. In one preferred embodiment, no deep trench interconnect structures for providing contact between surfaces 271 and 272 have been formed up to this point in fabrication.

Figure 6:
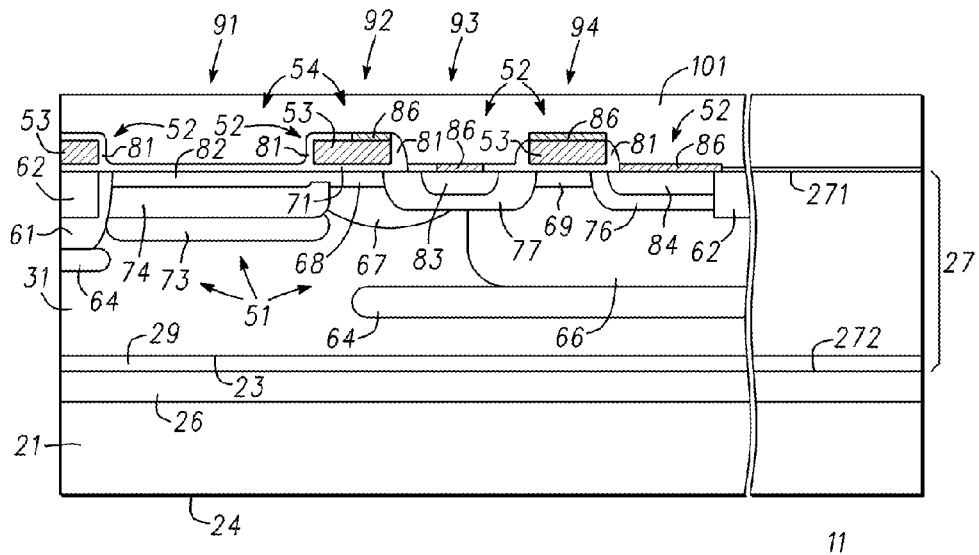

Turning now of FIGS. 6-17, additional process steps will be described in the manufacture of image sensor 11. FIG. 6 illustrates a partial cross-sectional view of image sensor 11 after additional processing. In one embodiment, a dielectric layer 101, first dielectric layer 101, or first interlayer dielectric (ILD) 101 is formed on or over conductive structures 52 and major surface 271 of semiconductor region 27. In one embodiment, dielectric layer 101 comprises one or more dielectric materials. In one embodiment, dielectric layer 101 comprises a high density plasma (HDP) deposited oxide and a phospho-silicate glass (PSG) layer forming on the HDP layer. In one embodiment, the PSG layer can be densified using rapid thermal anneal techniques. Next, the outer surface of dielectric layer 101 is planarized using, for example, chemical mechanical planarization (CMP) techniques to provide a substantially planar outer surface. In one embodiment, dielectric layer 101 has a thickness in a range from about 9,000 Angstroms to about 12,000 Angstroms after CMP. In other embodiments, dielectric 101 is not planarized.

Figure 7:
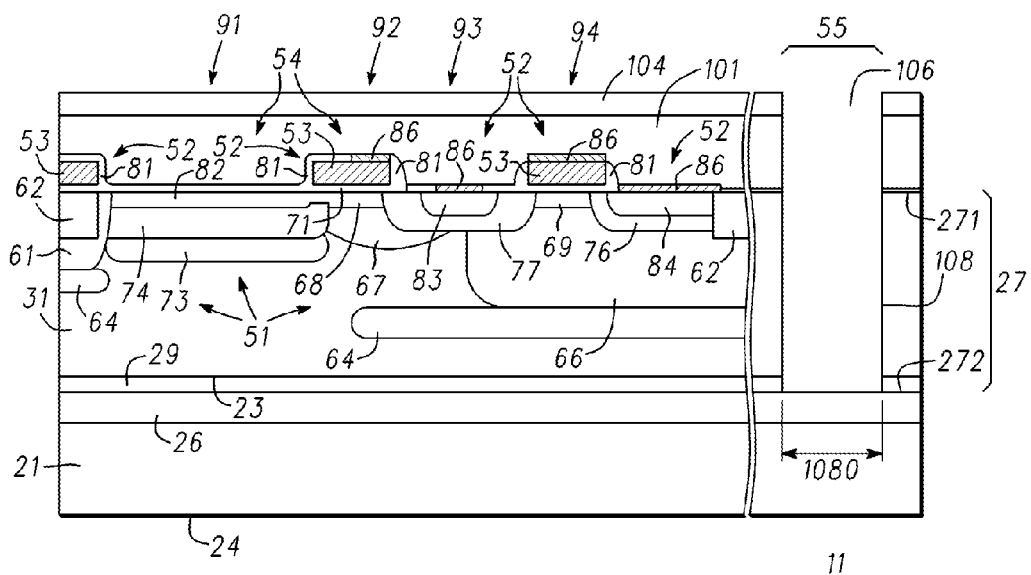

FIG. 7 illustrates a partial cross-sectional view of image sensor 11 after further processing. In one embodiment, a masking layer 104 is formed over dielectric layer 101 and patterned to provide an opening 106 over a portion 55, such as a peripheral portion 55, of semiconductor region 27. In one embodiment, masking layer 104 can be combination of a hard mask and a photosensitive mask. After opening 106 is formed, a deep etch trench process can be used to form a trench 108 in semiconductor region 27 extending from major surface 271 to major surface 272 and stopping on dielectric region 26. In one embodiment, reactive ion etching (RIE) using a xenon difluoride chemistry (e.g., $XeF_2$) can be used for etching trench 108. In alternative embodiments where deeper trenches are used, deep reactive ion etching (DRIE) etching with a fluorine or chlorine based chemistry can be used to form trench 108. Several techniques are available for DRIE including cryogenic, high-density plasma, or Bosch DRIE processing. After trench 108 is formed, masking layer 104 can be removed. Although trench 108 is illustrated as a single trench, in other embodiments, trench 108 can be a series of single disconnected trenches or a single interconnected serpentine trench around central semiconductor (e.g., silicon) support structures. In one embodiment, trench 108 can have a width 1080 from about 2.25 microns to about 2.65 microns. In one preferred embodiment, width 1080 is about 2.5 microns.

Figure 8:
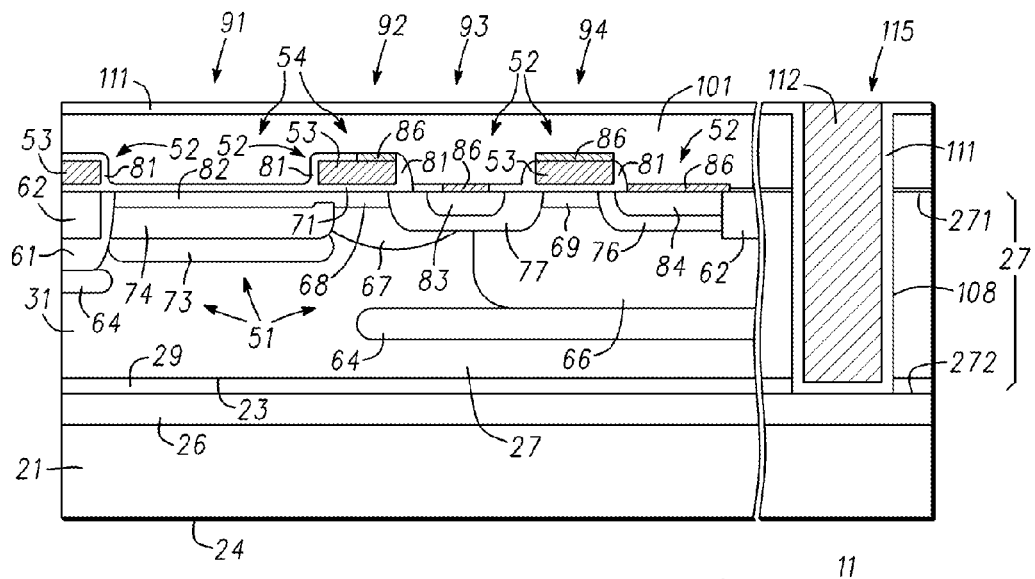

FIG. 8 illustrates a partial cross-sectional view of image sensor 11 after still further processing. In one embodiment, a dielectric layer 111, second dielectric layer 111, or dielectric liner 111 is formed along at least sidewall surfaces of trench 108. In one embodiment, dielectric layer 111 is provided along the lower or bottom surface of 108 as generally illustrated in FIG. 8. In one embodiment, dielectric layer 111 comprises a deposited oxide having a thickness in a range from about 1,500 Angstroms to about 2,600 Angstroms. In one embodiment dielectric layer 111 is deposited using LPCVD techniques and a TEOS source. In a subsequent step, a conductive material 112 is formed adjoining dielectric layer 111 including within trench 108. In accordance with one preferred embodiment, conductive material 112 comprises a metal material to provide for a lower resistance conductive layer within trench 108. In one preferred embodiment, conductive material 112 is other than a doped polycrystalline semiconductor material including other than doped polysilicon material.

In one embodiment, conductive material 112 comprises tungsten. In one preferred embodiment, conductive material 112 comprises a first metal layer comprising titanium adjoining dielectric layer 111, a second metal layer comprising titanium nitride adjoining the first metal layer, and a third metal layer comprising tungsten. In one embodiment, the conductive material is planarized using, for example, CMP techniques leaving conductive material 112 within trench 108. In one preferred embodiment, conductive material 112 completely fills trench 108 and is substantially co-planar with the upper surface of dielectric layer 111 or dielectric layer 101. In one embodiment, trench 108 and conductive material 112 are configured to provide a conductive trench structure 115, deep trench interconnect structure 115, or DTI structure 115. Because the method of the present embodiment forms doped regions 51 and conductive structures 52 before forming trench 108 with conductive material 112, the method enables the use of metal materials for conductive material 112 thereby improving the performance of image sensor 11. Additionally, because trench 108 is formed after doped regions 51 and conductive structures 52, less defects are formed along trench 108 thereby reducing stresses in image sensor 11 and further improving performance and reliability.

Figure 9:
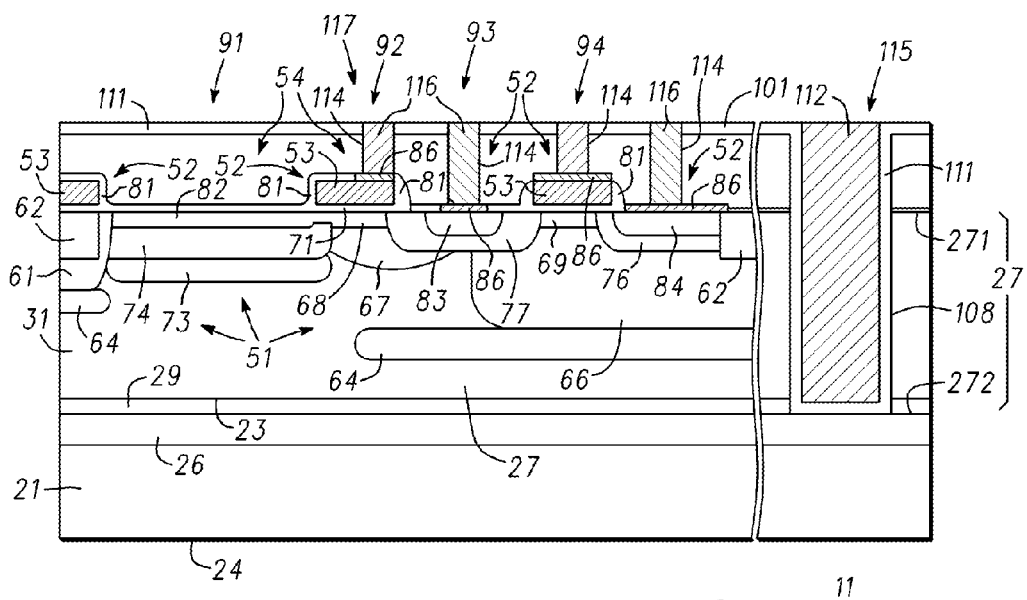

FIG. 9 illustrates a partial cross-sectional view of image sensor 11 after additional processing. In one embodiment, a contact masking and etch step is used to form openings 114 or vias 114 in dielectric layer 111 and dielectric layer 101 over at least a portion of conductive structures 52. By way of example, a photolithographic process can be used to form a masking layer (not shown). After vias 114 are formed, the masking layer can be removed. Next, conductive material 116 is formed within vias 114 and over dielectric layer 111. A planarization process, such as a CMP process, can be used to remove a portion of conductive material 116 and leaving another portion conductive material 116 within vias 114. In one embodiment, conductive material 116 comprises a first metal layer comprising titanium adjoining dielectric layer 111, a second metal layer comprising titanium nitride adjoining the first metal layer, and a third metal layer comprising tungsten. In accordance with the present embodiment, conductive material 116 and vias 114 are non-limiting examples of a plurality of conductive structures 117 electrically connected to plurality of conductive structures 52 and plurality of doped regions 51.

Figure 10:
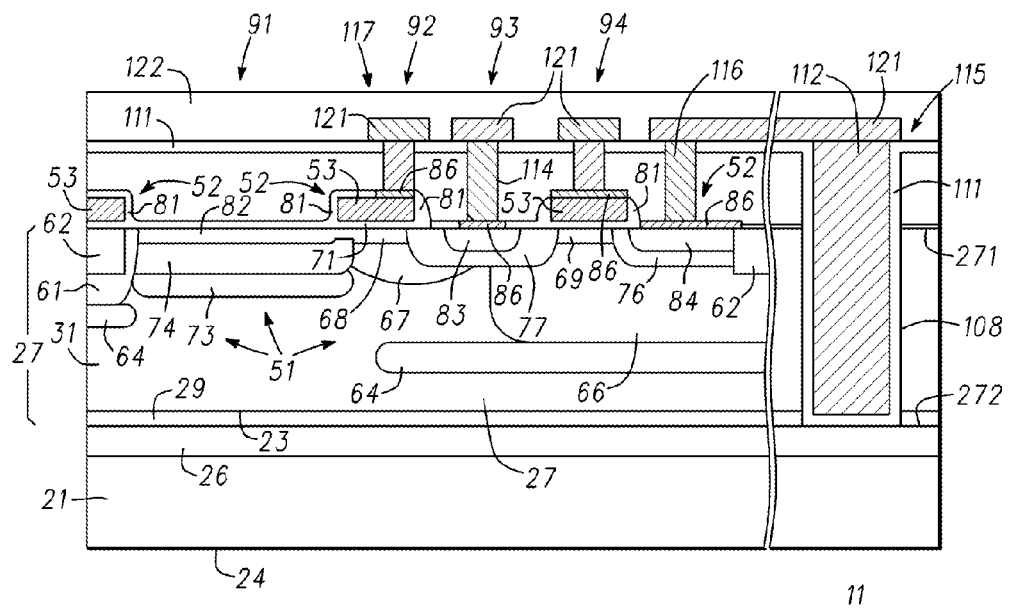

FIG. 10 illustrates a partial cross-sectional view of image sensor 11 after further processing. In one embodiment, a conductive layer 121, metal one layer 121, or first conductive layer 121 is formed overlying or on dielectric layer 111. In one embodiment, conductive layer 121 comprises a metal layer, such as aluminum, an aluminum alloy, copper, combinations thereof, or a similar conductive material as known to those of skill in the art. In one embodiment, aluminum/copper/silicon (Al/Cu/Si) with a Ti/TiN barrier metal below and a TiN anti-reflective coating (ARC) above can be used for conductive layer 121. After conductive layer 121 is formed, photolithographic masking and etching techniques can be used to pattern conductive layer 121 in a desired pattern. In one embodiment, conductive layer 121 is patterned to provide electrical connections to conductive structures 51 and conductive trench structure 115 as generally illustrated, for example, in FIG. 10. In a subsequent step, a dielectric layer 122 or ILD layer 122 is formed or disposed over or on dielectric layer 111 and conductive layer 121. In one embodiment, ILD layer 122 comprises a deposited oxide and can be planarized using, for example, CMP techniques. In one embodiment, ILD layer 122 can have a thickness in a range from about 5,500 Angstroms to about 8,500 Angstroms after CMP.

Figure 11:
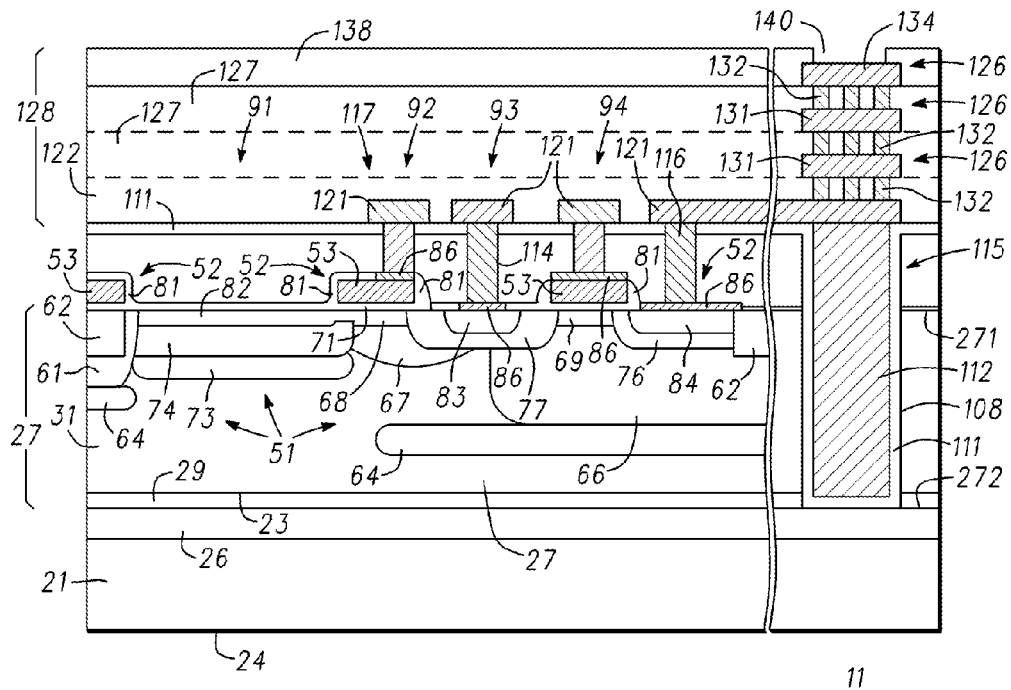

FIG. 11 illustrates a partial cross-sectional view of image sensor 11 after still further processing. In one embodiment, additional layers of conductive interconnects 126 and additional ILD layers 127 are formed in succession overlying ILD layer 122 to provide an insulated interconnect structure 128 that is electrically interconnected to conductive structures 52 and doped regions 51 and further electrically interconnected to conductive material 112 in conductive trench structure 115. In one embodiment, insulated interconnect structure 128 can further include ILD layer 122 and conductive layer 121. In one embodiment, conductive interconnects 126 include one or more conductive layers 131 interconnected with conductive vias 132 or conductive trench structures 132. Conductive layers 131 can be metal layers, such as aluminum, an aluminum alloy, or other conductive interconnect materials as known to those of skill in the art. ILD layers 127 can be deposited oxides, and can be planarized using, for example, CMP techniques. It is understood that more or fewer conductive interconnects 126 and ILD layers 127 can be used than what is illustrated in FIG. 11. In one embodiment, insulated interconnect structure 128 further comprises an outer contact 134 or top contact 134 formed on an uppermost ILD layer 127. In one embodiment, outer contact 134 can be a metal, such as a multi-layer structure including titanium, titanium nitride, aluminum/copper/silicon, and titanium nitride. Next, in one embodiment a passivation layer 138 can be formed overlying the uppermost ILD layer 127. In one embodiment, passivation layer 138 comprises several layers of dielectric material. In one embodiment, a deposited oxide having a thickness in a range from about 10,000 Angstroms to about 15,000 Angstroms is formed on uppermost ILD layer 127 and outer contact 134. In one embodiment, a high density plasma deposited oxide can be used. Next, a CMP process can be used to planarize the deposited oxide. In one embodiment, approximately 5,000 Angstroms to about 7,200 Angstroms can be left after the CMP step. In one embodiment, a silicon nitride layer is formed on the planarized oxide layer. In one embodiment, the silicon nitride layer can have thickness in a range from about 3,000 Angstroms to about 5,500 Angstroms. Next, passivation layer 138 is then patterned to provide a contact opening 140 to outer contact 134. At this stage of fabrication, image sensor 11 can be subject to certain wafer level testing, such as process control testing or other parametric testing/characterization.

Figure 12:
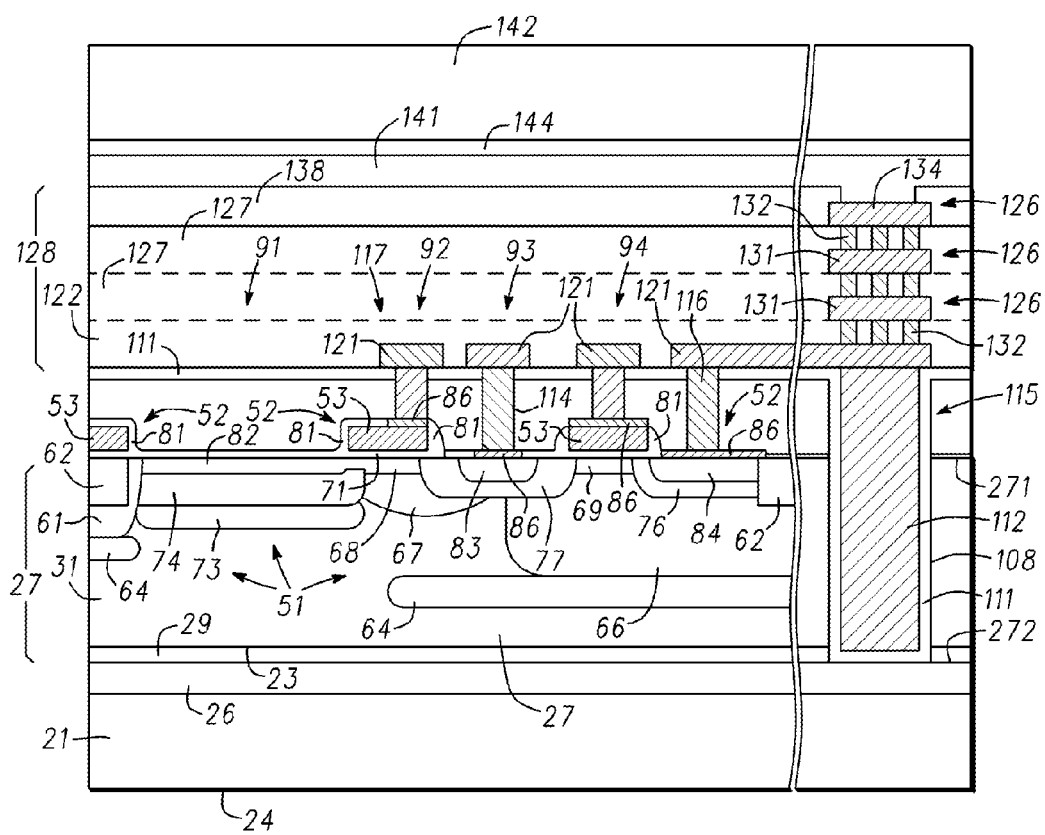

FIG. 12 illustrates a partial cross-sectional view of image sensor 11 after additional processing. In one embodiment, a dielectric layer 141 is formed on or overlying passivation layer 138 and can be planarized using, for example, CMP techniques. In one embodiment, a first dielectric layer is deposited on passivating layer and planarized to fill opening 140 (illustrated in FIG. 11) using the silicon nitride layer as a stop layer. In one embodiment the first dielectric layer comprises about 15,000 Angstroms of LPCVD oxide deposited using a TEOS source. After planarization, a second dielectric layer is deposited over passivation layer 138 and the first dielectric layer. In one embodiment, the second dielectric layer can be a deposited oxide that comprises about 15,000 Angstroms of LPCVD oxide deposited using a TEOS source. In accordance with the present embodiment, the second dielectric layer is then annealed for about 2 hours at approximately 230 degrees Celsius to about 260 degrees Celsius. In one embodiment, the second dielectric layer is then subjected to a final touch polish if the surface roughness is greater than about 5 Angstroms. This provides an enhanced surface for wafer bonding.

In a subsequent step, a carrier wafer 142, semiconductor substrate 142, or second semiconductor substrate 142 is attached to dielectric layer 141, using, for example, wafer bonding techniques. In one embodiment, semiconductor substrate 142 is provided pre-processed with pre-selected features, such as global alignment keys and/or backside scribe lines to better facilitate final front-end processing steps for image sensor 11. In one preferred embodiment, semiconductor substrate 142 includes an attachment layer 144, such as an oxide layer configured to bond to dielectric layer 141. In one embodiment, the oxide layer can be bonded directly to dielectric layer 141 using low temperature wafer bonding techniques. For example, dielectric layer 141 and the oxide layer on semiconductor substrate 142 provide two flat, very clean substrates with hydrophilic surfaces joined together by a slight mechanical force, then held together by Van der Waals forces. After room temperature bonding, annealing at elevated temperatures (e.g., approximately 400 degrees Celsius) fuses semiconductor substrate 142 to semiconductor substrate 21. In other embodiments, attachment layer 144 can be an adhesive layer or a permanent adhesive layer, such as a polyimide layer, a silicon adhesive layer, or other adhesive materials stable to up about 400 degrees Celsius. In one embodiment, the adhesive layer can be heat treated after semiconductor wafer 142 is attached to dielectric layer 141.

Figure 13:
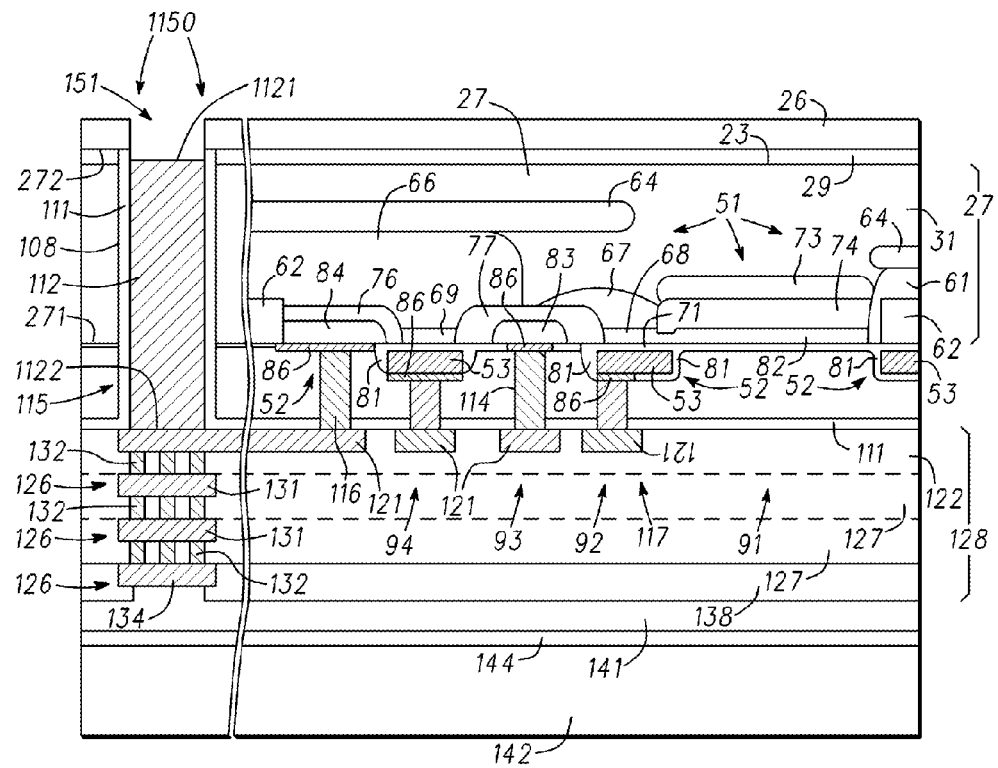

FIG. 13 illustrates a partial cross-sectional view of image sensor 11 after further processing. In one embodiment, semiconductor substrate 21 is removed from the structure stopping on dielectric region 26. In one embodiment, semiconductor substrate 21 can be removed using grinding and polishing techniques or other techniques as known to those of skill in the art. In accordance with the present embodiment, using dielectric layer 26 as a stop layer for the removal process provides an improvement in backside planarity or the planarity of semiconductor region 27 compared to previous processes that use over-etching techniques. Also previous processes that do not use SOI substrates and that do use polysilicon-filled trenches formed prior to any pixel structure formation are susceptible to unwanted sidewall oxide removal, which leads to defect generation during subsequent processing.

In a subsequent step, a masking layer (not shown) can be disposed over dielectric layer 26 with an opening 151 overlying at least a portion of conductive trench structure 115. One advantage of the present embodiment is that conductive trench structure 115 provides a convenient alignment structure 1150 or alignment feature 1150 for aligning the mask to form opening 151. Thereafter, portions of dielectric layer 26 and dielectric layer 111 (if present) can be removed to expose a surface 1121 of conductive material 112. In the present embodiment, surface 1121 is opposite or opposed to a surface 1122 of conductive material 112, which is electrically connected to insulated conductive structure 128.

Figure 14:
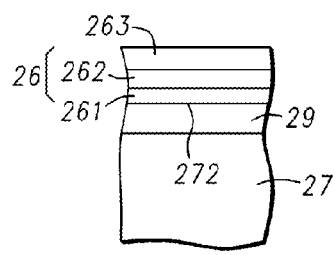
FIGS. 14 and 15 illustrate partial cross-sectional views of the structure of FIG. 13 in accordance with an alternative embodiment of the present invention.
Figure 15:
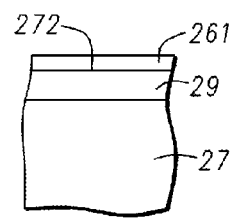

FIGS. 14 and 15 are partial cross-sectional views of a portion of semiconductor region 27 in accordance with an alternative embodiment where dielectric region 26 includes first dielectric layer 261, second dielectric layer 262, and third dielectric layer 263. In accordance with this embodiment, after semiconductor substrate 21 is removed, third dielectric layer 263 and second dielectric layer 262 can also be removed leaving first dielectric layer 261 in place adjoining major surface 272 of semiconductor region 27. In alternative embodiment, second dielectric layer 262 can be also left in place with first dielectric layer 261. In a further embodiment, both second dielectric layer 262 and third dielectric layer 263 can be left in place with first dielectric layer 261. Thereafter, opening 151 can be formed as described previously.

Figure 16:
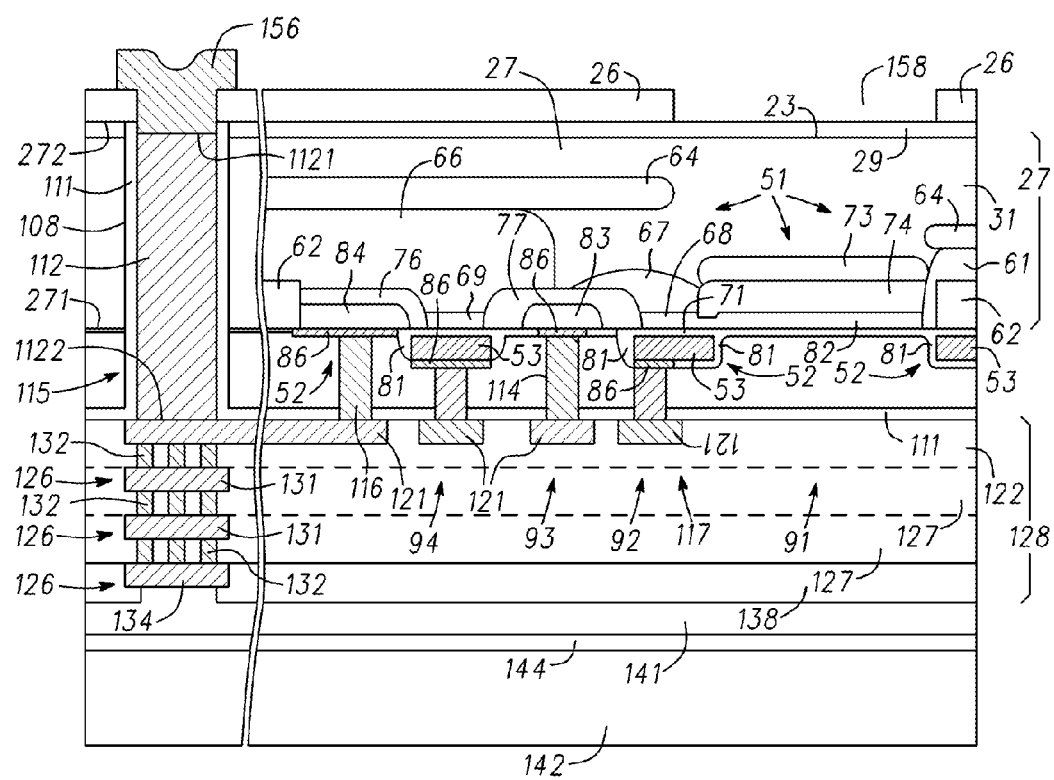
FIG. 16 illustrates a partial cross-sectional view of the image sensor device after further manufacturing in accordance with the present invention.
Figure 17:
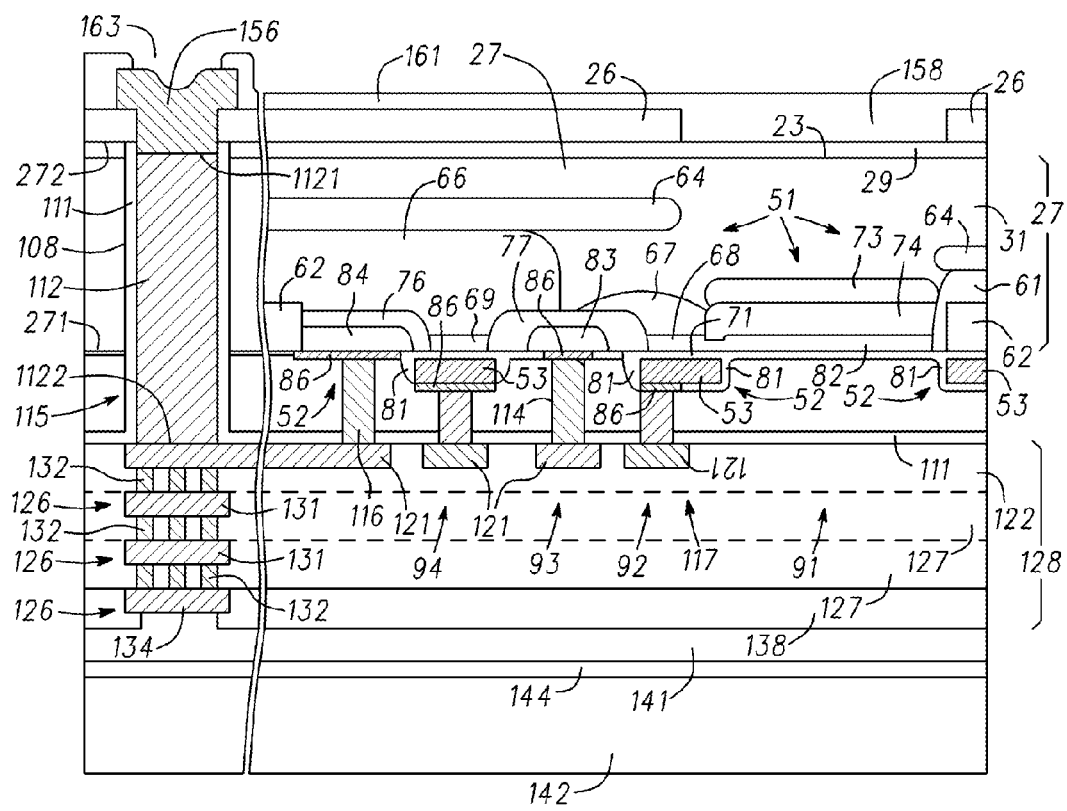
FIG. 17 illustrates a partial cross-sectional view of the image sensor device after further processing in accordance with an embodiment of the present invention.

FIG. 16 illustrates a partial cross-sectional view of image sensor 11 after still further processing. In one embodiment, a contact layer 156, conductive contact 156, conductive electrode 156, or first electrode 156 is formed on a portion of dielectric region 26 and electrically connected to conductive material 112 of conductive trench structure 115. In one embodiment, conductive contact 156 is electrically connected to surface 1121 of conductive material 112. In one embodiment, conductive contact 156 comprises a metal, such as a multi-layer structure including titanium, titanium nitride, aluminum/copper/silicon, and titanium nitride, or other suitable material(s) as known to those of skill in the art. Photolithographic patterning and etching processes can be used to form conductive contact 156. In accordance with one embodiment, one or more of conductive layers 121, conductive interconnects 126, and outer contact 134 are examples of a first contact structure electrically connected to surface 1122 of conductive trench structure 115 and conductive gate structures 53; and conductive contact 156 is an example of a second contact structure electrically connected to surface 1121 of conductive trench structure 115. In one embodiment, another masking layer can be formed overlying dielectric region 26 and an opening 158 can be formed within dielectric region 26 preferably overlying at least a portion of photodiode 91.

FIG. 17 illustrates a partial cross-sectional view of image sensor 11 after additional processing. In one embodiment, an anti-reflective coating (ARC) layer 161 is disposed within opening 158 and overlying dielectric region 26. In one embodiment, ARC layer 161 can comprises one or more layers of dielectric material. In one embodiment, ARC layer 161 comprises a first dielectric layer comprising an oxide, a second dielectric layer on the first dielectric layer comprising a nitride, and a third dielectric layer on the second dielectric layer comprising an oxide. After ARC layer 161 is formed, an opening 163 is formed overlying conductive contact 156 for facilitating electrical connection of image sensor 11 to a next level of assembly, such as another semiconductor device, control circuitry, a package structure, or another structure as known to those of skill in the art. In accordance with the present embodiment, a portion of dielectric region 26 (or first pad dielectric layer 261) remains in the final structure of image sensor 11.

Figure 18:
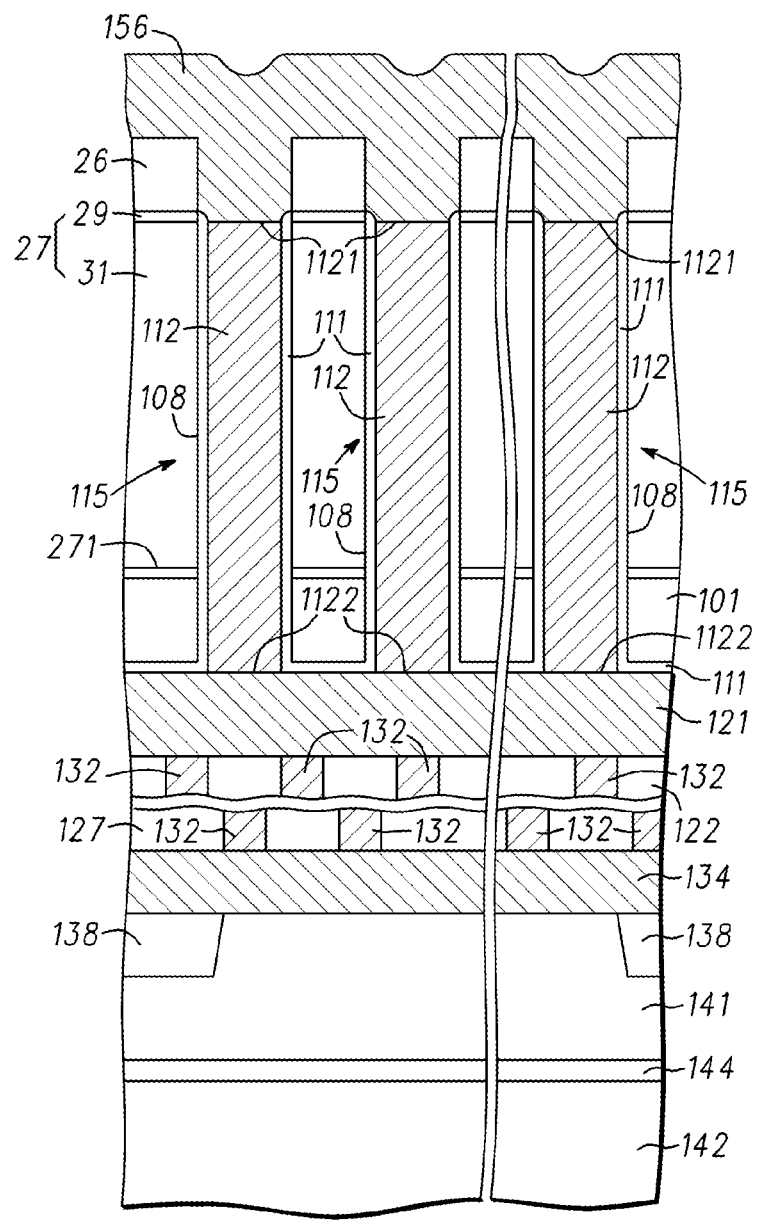
FIG. 18 illustrates a partial cross-sectional view of an image sensor device in accordance with another embodiment of the present invention.

FIG. 18 illustrates a partial cross-sectional view of an image sensor 110 in accordance with alternative embodiments. Image sensor 110 is similar to image sensor 11 and the only differences will be described hereinafter. In one embodiment, a plurality of conductive trench structures 115 are used to provide electrical connection to one or more of conductive layers 121 and conductive contact 156. In accordance with the present embodiment, plurality of conductive trenches 115 can be a plurality of individual trenches, or can be a single trench configured in, for example, a serpentine pattern. In some embodiments, the serpentine pattern is preferred to provide reduced resistance, improved process capability, and improved reliability.

From all of the foregoing, one skilled in the art can determine that, according to one embodiment, a method for forming an image sensor device (for example, element 11, 110) comprises providing a semiconductor substrate (for example, element 21) comprising a first major surface (for example, element 23) and an opposing second major surface (for example, element 24), wherein the semiconductor substrate further comprises a first dielectric region (for example, element 26, 261, 262, 263) disposed adjacent the first major surface and a first semiconductor region (for example, element 27, 29, 31) disposed adjacent the first dielectric region. The method includes forming a plurality of doped regions (for example, element 51) within the first semiconductor region and forming a plurality of conductive structures (for example, element 52) on the first semiconductor region and adjacent at least portions of the plurality of doped regions, wherein the plurality of doped regions and the plurality of conductive structures are configured as a pixel structure (for example, element 54). The method includes thereafter forming a trench (for example, element 108) extending through the first semiconductor region to the first dielectric region and providing a conductive material (for example, element 112) within the trench, wherein the conductive material is electrically isolated from the first semiconductor region, and wherein the conductive material comprises a metal, and wherein the trench and the conductive material are configured as a conductive trench structure (for example, element 115). The method includes forming an insulated interconnect structure (for example, element 128) overlying the first semiconductor region, wherein the insulated interconnect structure is electrically coupled to the conductive material in the trench. The method includes removing the semiconductor substrate and leaving at least a portion of the first dielectric region in place adjacent to the first semiconductor region. The method includes forming a first electrode (for example, element 156) on the first dielectric region and electrically coupled to the conductive material in the trench.

Those skilled in the art will also appreciate that, according to another embodiment, a method for forming a backside illuminated image sensor device (for example, elements 11, 110) comprises providing a semiconductor substrate (for example, element 21) comprising a first major surface (for example, element 23) and an opposing second major surface (for example, element 24), wherein the semiconductor substrate further comprises a first dielectric region (for example, element 26, 261, 262, 263) disposed adjacent the first major surface and a first semiconductor region (for example, element 27, 29, 31) disposed adjacent the first dielectric region, wherein the first semiconductor region comprises a first surface (for example, element 271) spaced apart from the first dielectric region. The method includes forming a plurality of doped regions (for example, element 51) within the first semiconductor region adjacent the first surface and forming a plurality of conductive gate structures (for example, element 52, 53) adjacent the first surface and adjacent at least portions of the plurality of doped regions, wherein the plurality of doped regions and the plurality of conductive gates comprise a pixel structure (for example, element 54). The method includes thereafter forming a conductive trench structure (for example, element 115) extending through the first semiconductor region to the first dielectric region, wherein the conductive trench structure comprises a conductive material (for example, element 112) electrically isolated from the first semiconductor region, and wherein the conductive material comprises a metal. The method includes forming an insulated interconnect structure (for example, element 128) overlying the first dielectric layer, wherein the insulated interconnect structure is electrically coupled to a first surface (for example, element 1122) of the conductive material in the trench. The method includes attaching a carrier substrate (for example, element 142, 144) to an outer surface (for example, element 141) of the insulated interconnect structure. The method includes removing the semiconductor substrate and leaving at least a portion of the first dielectric region in place adjacent the first semiconductor region. The method includes forming a first electrode (for example, element 156) adjacent the first dielectric region and electrically coupled to second surface (for example, element 1121) of the conductive material in the trench.

Those skilled in the art will also appreciate that, according to a further embodiment, a method for forming a backside illuminated image sensor comprises providing a region of semiconductor material (for example, element 27) having a first major surface (for example, element 271) and a second major surface (for example, element 272). The method includes forming a pixel structure (for example, element 54) within the region of semiconductor material adjacent the first major surface, the pixel structure including a plurality of doped regions (for example, element 51) and a plurality of conductive structures (for example, element 52). The method includes thereafter forming a conductive trench structure (for example, element 115) extending from the first major surface to the second major surface, wherein the conductive trench structure comprises a metal material, and wherein the conductive trench structure has a first surface (for example, element 1122) proximate to the first major surface of the region of semiconductor material and a second surface (for example, element 1121) adjacent the second major surface of the region of semiconductor material. The method includes forming a first contact structure (for example, element 121, 128) electrically coupled to the first surface of the conductive trench structure. The method includes forming a second contact structure (for example, element 156) electrically coupled to the second surface of the conductive trench structure, wherein the second major surface (for example, element 272) is configured to receive incident light.

Those skilled in the art will also appreciate that, according to a still further embodiment, an image sensor structure comprises a region of semiconductor material (for example, element 27) having a first major surface (for example, element 271) and a second major surface (for example, element 272). A pixel structure (for example, element 54) is disposed within the region of semiconductor material adjacent the first major surface, wherein the pixel structure includes a plurality of doped regions (for example, element 51). A conductive trench structure (for example, element 115) is disposed in the region of semiconductor material extending from the first major surface to the second major surface, wherein the conductive trench structure comprises a metal material (for example, element 112), and wherein the conductive trench structure has a first surface (for example, element 1122) adjacent the first major surface of the region of semiconductor material and a second surface (for example, element 1121) adjacent the second major surface of the region of semiconductor material. A first contact structure (for example, element 121, 128) is electrically coupled to the first surface of the conductive trench structure. A second contact structure (for example, element 156) is electrically coupled to the second surface of the conductive trench structure, wherein the second major surface is configured to receive incident light.

In another embodiment of the structure, a carrier substrate (141) is attached to the region of semiconductor material proximate to the first major surface.

In view of all of the above, it is evident that novel BSI image sensor structure and method of forming the BSI image sensor structure have been described. Included among other features, is a conductive trench structure comprising a metal material that facilitates electrical communication between two major surfaces of a region of semiconductor material. One major surface is configured for receiving incident light, and pixel structures on the opposing material surface are configured to receive and transmit the incident light in the form of stored charge. The conductive trench structure facilitates electrical communication between the pixel structure and other components, such as other semiconductor devices or control circuitry. Among other things, the metal material in the conductive trench structure reduces electrical resistance thereby improving the performance of the image sensor device. Also, the method produces an image sensor having reduced defects thereby reducing dark current effects. Additionally, the conductive trench structure provides improved isolation between adjacent pixels thereby reducing cross-talk and other forms of interference.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for forming an image sensor device comprising:
   providing a semiconductor substrate comprising a first major surface and an opposing second major surface, wherein the semiconductor substrate further comprises a first dielectric region disposed adjacent the first major surface and a first semiconductor region disposed adjacent the first dielectric region;
   forming a plurality of doped regions within the first semiconductor region;
   forming a plurality of conductive structures on the first semiconductor region and adjacent at least portions of the plurality of doped regions, wherein the plurality of doped regions and the plurality of conductive structures are configured as a pixel structure;
   thereafter forming a trench extending through the first semiconductor region to the first dielectric region;
   providing a conductive material within the trench, wherein the conductive material is electrically isolated from the first semiconductor region, and wherein the conductive material comprises a metal, and wherein the trench and the conductive material are configured as a conductive trench structure;
   forming an insulated interconnect structure overlying the first semiconductor region, wherein the insulated interconnect structure is electrically coupled to the conductive material in the trench;
   removing the semiconductor substrate and leaving at least a portion of the first dielectric region in place adjacent to the first semiconductor region; and
   forming a first electrode on the first dielectric region and electrically coupled to the conductive material in the trench.

2. The method of claim 1, further comprising:
   forming a first dielectric layer over the plurality of conductive structures and the first semiconductor region, wherein forming the trench comprises forming the trench extending through the first dielectric layer and the first semiconductor region to the first dielectric region, and wherein forming the insulated interconnect structure comprises:
   forming a plurality of conductive contact structures within the first dielectric layer and electrically coupled to the plurality of conductive structures and the plurality of doped regions;
   forming a first conductive interconnect structure adjacent the first dielectric layer, wherein the first conductive interconnect structure is electrically coupled to the conductive material within the trench and at least a portion of the plurality of conductive contact structures;
   forming a second dielectric layer overlying the first conductive interconnect structure and the first dielectric layer;
   forming a top conductive structure overlying the second dielectric layer, the top conductive structure electrically coupled to the first conductive interconnect structure;
   forming a third dielectric layer overlying the top conductive structure;
   forming an opening exposing at least portions of the top conductive structure using the conductive trench structure as an alignment feature; and
   forming a fourth dielectric layer overlying the third dielectric layer, wherein the fourth dielectric layer comprises a substantially planar outer surface.

3. The method of claim 1 further comprising:
   attaching a carrier substrate to an outer surface of the insulated interconnect structure before removing the semiconductor substrate;
   removing a portion of the first dielectric region overlapping at least a portion of the plurality of doped regions;
   providing an anti-reflective coating layer overlapping the plurality of doped regions; and
   exposing a portion of the first electrode.

4. The method of claim 3, wherein removing the portion of the first dielectric region comprises exposing a part of the first semiconductor region and leaving another portion of the first dielectric region in place adjacent another part of the first semiconductor region.

5. The method of claim 4, wherein exposing comprises providing an opening in the first dielectric region overlying a portion of the plurality of doped regions comprising a photodiode.

6. The method of claim 1, wherein providing the conductive material within the trench comprises:
   providing a second dielectric layer lining at least sidewall surfaces of the trench; and
   providing the conductive material adjoining the second dielectric layer.

7. The method of claim 6, wherein providing the conductive material comprises providing the conductive material comprising tungsten, the method further comprising planarizing the conductive material.

8. The method of claim 3, wherein attaching the carrier substrate comprises attaching with an adhesive layer.

9. The method of claim 1, wherein providing the semiconductor substrate comprises:
   providing the first semiconductor region comprising a first semiconductor layer adjacent the first dielectric region; and
   providing a second semiconductor layer adjacent the first semiconductor layer, wherein the first semiconductor layer has a higher dopant concentration than the second semiconductor layer.

10. The method of claim 1, wherein providing the semiconductor substrate comprises providing the first semiconductor region having a thickness in a range from about 7 microns to about 12 microns.

11. The method of claim 1, wherein providing the semiconductor substrate comprises:
    providing a first semiconductor substrate having first and second opposing major surfaces;

forming a first semiconductor layer overlying the first major surface of the first semiconductor substrate;

forming the first dielectric region adjacent the first semiconductor layer;

attaching a second semiconductor substrate to the first dielectric region; and removing portions of the first semiconductor substrate from the second major surface to provide the first semiconductor region.

12. The method of claim 11, wherein forming the first dielectric region comprises:

forming a first pad dielectric layer overlying the first semiconductor layer;

forming a second pad dielectric layer overlying the first pad dielectric layer, wherein the second pad dielectric layer and the first pad dielectric layer comprise different materials; and forming a third pad dielectric layer overlying the second pad dielectric layer, wherein the third pad dielectric layer and the second pad dielectric layer comprise different materials, and wherein at least a portion of the first pad dielectric layer remains as part of the semiconductor image sensor device.

13. The method of claim 1, wherein providing the semiconductor substrate comprises:

providing a first semiconductor substrate having first and second opposed major surfaces;

providing the first dielectric region within the first semiconductor substrate adjacent the first major surface of the first semiconductor substrate;

providing a first semiconductor layer adjacent the first major surface of the first semiconductor substrate; and providing a second semiconductor layer adjacent the first semiconductor layer, wherein the first semiconductor region comprises the first semiconductor layer and the second semiconductor layer.

14. A method for forming a backside illuminated image sensor device comprising:

providing a semiconductor substrate comprising a first major surface and an opposing second major surface, wherein the semiconductor substrate further comprises a first dielectric region disposed adjacent the first major surface and a first semiconductor region disposed adjacent the first dielectric region, wherein the first semiconductor region comprises a first surface spaced apart from the first dielectric region;

forming a plurality of doped regions within the first semiconductor region adjacent the first surface;

forming a plurality of conductive gate structures adjacent the first surface and adjacent at least portions of the plurality of doped regions, wherein the plurality of doped regions and the plurality of conductive gates comprise a pixel structure;

thereafter forming a conductive trench structure extending through the first semiconductor region to the first dielectric region, wherein the conductive trench structure comprises a conductive material electrically isolated from the first semiconductor region, and wherein the conductive material comprises a metal;

forming an insulated interconnect structure overlying the first surface of the first semiconductor region, wherein the insulated interconnect structure is electrically coupled to a first surface of the conductive material in the trench;

attaching a carrier substrate to an outer surface of the insulated interconnect structure;

removing the semiconductor substrate and leaving at least a portion of the first dielectric region in place adjacent the first semiconductor region; and forming a first electrode adjacent the first dielectric region and electrically coupled to the second surface of the conductive material in the trench.

15. The method of claim 14 further comprising:

forming a first dielectric layer over the first plurality of conductive gate structures and the first surface of the first semiconductor region, wherein forming the conductive trench structure comprises:

forming a trench extending through the first dielectric layer and the first semiconductor region to the first dielectric region;

providing a second dielectric layer lining at least sidewall surfaces of the trench;

providing the conductive material adjoining the second dielectric layer; and planarizing the conductive material.

16. The method of claim 14, wherein providing the semiconductor substrate comprises:

providing a first semiconductor substrate having first and second opposing major surfaces;

forming a first semiconductor layer overlying the first major surface of the first carrier substrate;

forming the first dielectric region adjacent the first semiconductor layer;

attaching a second semiconductor substrate to the first dielectric region; and removing portions of the first semiconductor substrate from the second major surface to provide the first semiconductor region.

17. The method of claim 14, wherein providing the semiconductor substrate comprises:

providing a first semiconductor substrate having first and second opposed major surfaces;

providing the first dielectric region within the first semiconductor substrate adjacent the first major surface of the first semiconductor substrate;

providing a first semiconductor layer adjacent the first major surface of the first semiconductor substrate; and providing a second semiconductor layer adjacent the first semiconductor layer, wherein the first semiconductor region comprises the first semiconductor layer and the second semiconductor layer.

18. A method for forming a backside illuminated image sensor comprising:

providing a region of semiconductor material having a first major surface and a second major surface;

forming a pixel structure within the region of semiconductor material adjacent the first major surface, the pixel structure including a plurality of doped regions and a plurality of conductive structures;

thereafter forming a conductive trench structure extending from the first major surface to the second major surface, wherein the conductive trench structure comprises a metal material, and wherein the conductive trench structure has a first surface proximate to the first major surface of the region of semiconductor material and a second surface adjacent the second major surface of the region of semiconductor material;

forming a first contact structure electrically coupled to the first surface of the conductive trench structure; and forming a second contact structure electrically coupled to the second surface of the conductive trench structure, wherein the second major surface is configured to receive incident light.

19. The method of claim 18, wherein forming the conductive trench structure comprises:
   forming a trench extending through the region of semiconductor material;
   forming a dielectric layer lining at least sidewall surfaces of the trench;
   providing the conductive material adjoining the dielectric layer; and
   wherein the method further comprising planarizing the conductive material.

20. The method of claim 18, wherein:
   providing the region of semiconductor material comprises:
      providing a dielectric region adjoining the second major surface of the region of semiconductor material;
      providing a first semiconductor layer adjoining the dielectric region; and
      providing a second semiconductor layer adjoining the first semiconductor layer, wherein the first semiconductor layer has a higher dopant concentration than the second semiconductor layer; and
   the method further comprises:
      removing a portion of the dielectric region from a first part of the second major surface overlapping the plurality of pixels and leaving another portion of the dielectric region on a second part of the second major surface; and
      providing an anti-reflective coating at least overlapping the first part of the second major surface.

* * * * *